United States Patent
Zhao et al.

(10) Patent No.: US 10,163,998 B2
(45) Date of Patent: Dec. 25, 2018

(54) TFT ARRAY SUBSTRATE STRUCTURE BASED ON OLED

(71) Applicant: SHENZHEN ROYOLE TECHNOLOGIES CO. LTD., Shenzhen (CN)

(72) Inventors: Jigang Zhao, Shenzhen (CN); Peng Wei, Shenzhen (CN); Xiaojun Yu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/524,071

(22) PCT Filed: Nov. 14, 2014

(86) PCT No.: PCT/CN2014/091176
§ 371 (c)(1),
(2) Date: May 3, 2017

(87) PCT Pub. No.: WO2016/074241
PCT Pub. Date: May 19, 2016

(65) Prior Publication Data
US 2017/0352715 A1    Dec. 7, 2017

(51) Int. Cl.
*H01L 29/08* (2006.01)
*H01L 35/24* (2006.01)
(Continued)

(52) U.S. Cl.
CPC ...... *H01L 27/3262* (2013.01); *H01L 27/3276* (2013.01); *H01L 27/3279* (2013.01);
(Continued)

(58) Field of Classification Search
USPC ... 257/40, 642–643, 759, E51.001–E51.052, 257/E25.008–E25.009, 99, E33.059,
(Continued)

(56) References Cited

U.S. PATENT DOCUMENTS

2007/0152217 A1   7/2007 Lai
2011/0121302 A1*  5/2011 Lee ............... H01L 27/3262
                                            257/59
(Continued)

FOREIGN PATENT DOCUMENTS

EP    2216821 A2    8/2010
JP    2010-251156 A    11/2010
(Continued)

OTHER PUBLICATIONS

Extended European search report dated Aug. 14, 2018 from corresponding application No. EP 14905996.6.

*Primary Examiner* — Tram H Nguyen
(74) *Attorney, Agent, or Firm* — Hauptman Ham, LLP

(57) ABSTRACT

A thin film transistor (TFT) array substrate structure based on organic light-emitting diodes (OLEDs) may include multiple sets of TFT components, capacitors, common electrodes, and data signal lines, all of which are formed on a substrate. Each set of TFT components includes a driving TFT, and the driving TFT has a gate, a source, and a drain. A drain frame extends from the drain and surrounds a pixel block of the TFT array substrate structure, and a transparent conductive film is arranged in a region surrounded by the drain frame and is in contact with the drain frame.

5 Claims, 6 Drawing Sheets

(51) Int. Cl.
   *H01L 51/00*    (2006.01)
   *H01L 27/32*    (2006.01)
   *H01L 51/52*    (2006.01)
   H01L 29/417    (2006.01)
   H01L 27/12    (2006.01)

(52) U.S. Cl.
   CPC ...... *H01L 51/5206* (2013.01); *H01L 51/5221*
      (2013.01); *H01L 27/124* (2013.01); *H01L*
      *27/3265* (2013.01); *H01L 29/41733* (2013.01);
                  *H01L 51/5212* (2013.01)

(58) Field of Classification Search
   USPC ............ 257/E21.503; 438/29, 69, 82, 99, 28
   See application file for complete search history.

(56) References Cited

U.S. PATENT DOCUMENTS

| | | |
|---|---|---|
| 2011/0220898 A1 | 9/2011 | Yoon et al. |
| 2011/0303921 A1 | 12/2011 | Shin |
| 2012/0080681 A1* | 4/2012 | Kim .................... H01L 27/3262 257/59 |

FOREIGN PATENT DOCUMENTS

| | | |
|---|---|---|
| JP | 2012-15129 A | 1/2012 |
| JP | 2012-129197 A | 7/2012 |

* cited by examiner

TFT ARRAY SUBSTRATE STRUCTURE BASED ON OLED

TECHNICAL FIELD

The present disclosure relates to the field of display technology, and particularly to a thin film transistor (TFT) array substrate structure based on organic light-emitting diodes (OLEDs).

BACKGROUND

For typical bottom-emitting OLED display, transparent pixel electrodes are generally made from metal oxides such as indium tin oxide (ITO), indium zinc oxide (IZO), etc. The transparent pixel electrodes can allow light to pass through the pixel electrodes and a substrate, to realize display and luminescence function. However, since a metal oxide film has a higher resistivity and can generate great heat, in order to obtain a lower resistance, an ITO film is generally needed to be deposited to reach a larger thickness, for example, the thickness is within a range from 200 nm to 300 nm. The thicker ITO film will result in the increase of manufacturing cost and, more importantly, potential low reliability. In particular, for a flexible display device, the pixel electrode having a larger thickness may tend to be broken or peeled off when the flexible display device is repeatedly bent, particularly for the ITO film with poor ductility. Therefore, what is needed is to provide a new type of electrode structure to solve the problem.

SUMMARY

The present disclosure aims to provide a TFT array substrate structure based on OLEDs. By means of the TFT array substrate structure, the thickness of transparent pixel electrodes is reduced, whereby the manufacturing cost and the possibility of occurrence of a potential defect are reduced.

The present disclosure is realized in this way: a TFT array substrate structure based on OLEDs may include multiple sets of TFT components, capacitors, common electrodes, and data signal lines, all of which are formed on a substrate. Each set of TFT components may include a driving TFT, and the driving TFT may include a gate, a source, and a drain. A drain frame extends from the drain and surrounds a pixel block of the TFT array substrate structure, and a transparent conductive film is arranged in a region surrounded by the drain frame and is in contact with the drain frame.

In the present disclosure, the metal drain frame extends from the drain of the driving TFT, and the transparent conductive film is arranged within and coupled to the frame, and the frame and the transparent conductive film constitute the pixel electrode. Comparing with a pixel electrode only using the transparent conductive film having the same thickness, the resistance of the pixel electrode is significantly reduced. In the case of the same resistance, the thickness of the transparent conductive film that is coupled to the metal frame is much smaller than that of the transparent conductive film alone. The thickness of the transparent conductive film can be reduced by providing the metal frame, thereby reducing the manufacturing cost and the possibility of occurrence of a potential defect. In particular, for a flexible display device, the occurrence of breakage and peeling of the electrode structure during repeated bending can be avoided, and the reliability of the flexible display device can be improved.

BRIEF DESCRIPTION OF THE DRAWINGS

FIG. 1-2 is a cross-sectional view of an electrode structure of FIG. 1-1 along a section line thereof.

FIG. 2-1 is a top view of a TFT array substrate structure based on OLEDs in accordance with an embodiment of the present disclosure.

FIG. 2-2 is a cross-sectional view of an electrode structure of FIG. 2-1 along a section line thereof.

FIG. 3-1 is a top view of a TFT array substrate structure based on OLEDs in accordance with an embodiment of the present disclosure.

FIG. 3-2 is a cross-sectional view of an electrode structure of FIG. 3-1 along a section line thereof.

FIG. 4-1 is a top view of a TFT array substrate structure based on OLEDs in accordance with an embodiment of the present disclosure.

FIG. 4-2 is a cross-sectional view of an electrode structure of FIG. 4-1 along a section line thereof.

FIG. 5-1 is a top view of a TFT array substrate structure based on OLEDs in accordance with an embodiment of the present disclosure.

FIG. 5-2 is a cross-sectional view of an electrode structure of FIG. 5-1 along a section line thereof.

DETAILED DESCRIPTION

The present disclosure will now be described in further detail with reference to the accompanying drawings and the embodiments, in which the objects, technical solution, and advantages of the present disclosure will become more apparent from the following description. It is to be understood that the specific embodiments described herein are merely illustrative of the present disclosure and are not intended to limit the present disclosure.

Specific implementations of the present disclosure will now be described in detail with reference to specific embodiments.

Figure 1:
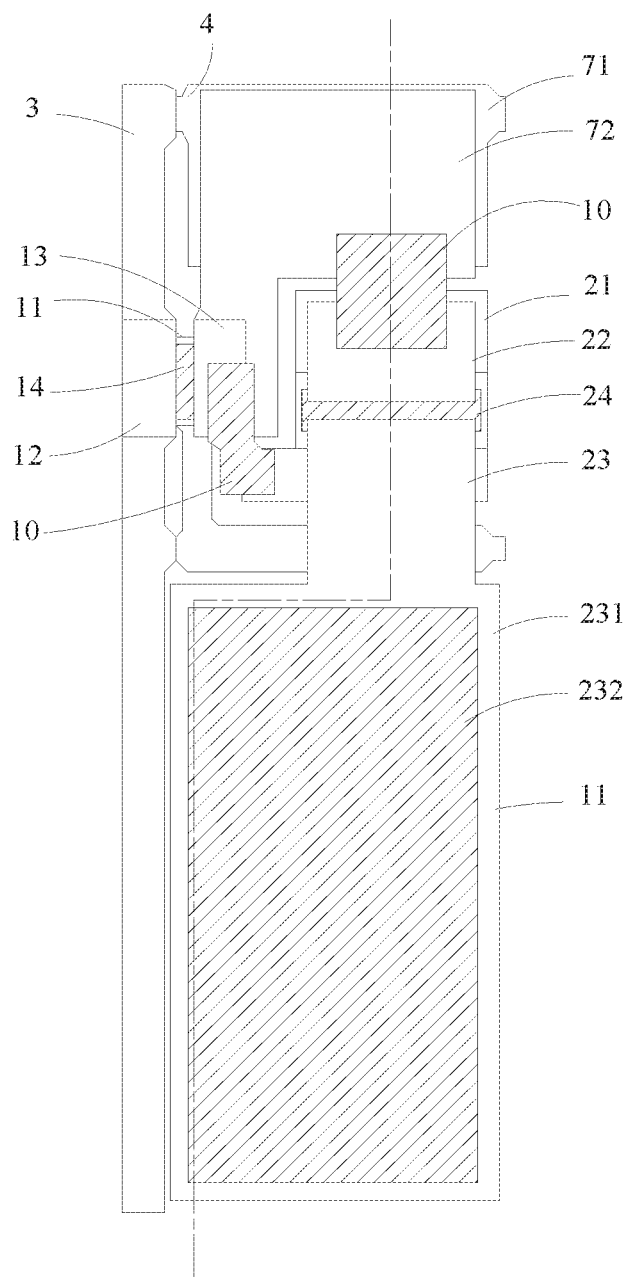
FIG. 1-1 is a top view of a TFT array substrate structure based on OLEDs in accordance with an embodiment of the present disclosure.
Figures 1, 2:
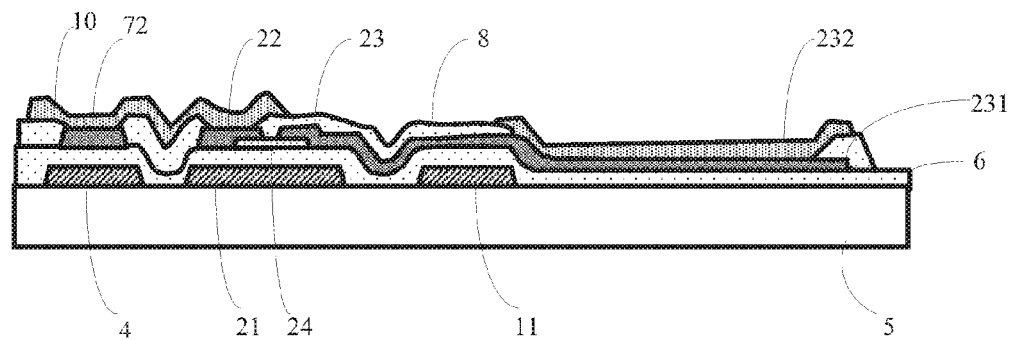
Figures 1, 2:
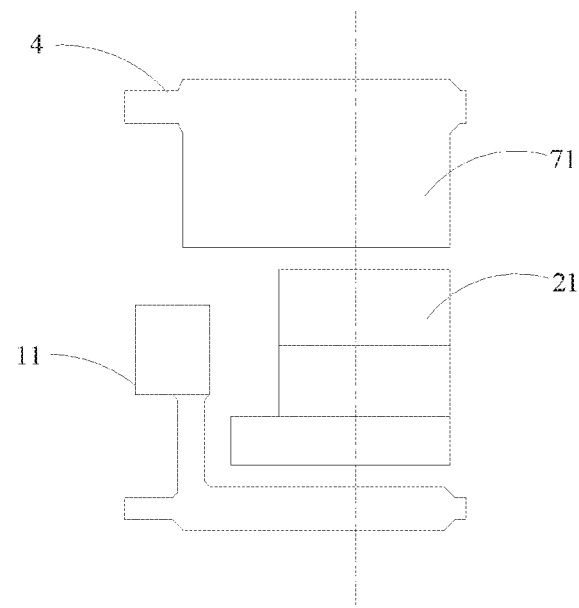
Figure 2:
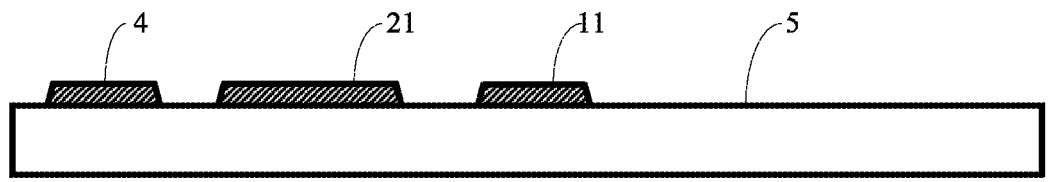

Referring to FIGS. 1-1 and 1-2, the present disclosure provides a TFT array substrate structure based on OLEDs. It is to be understood that only an electrode structure corresponding to a pixel is illustrated, and the entire TFT array substrate structure is an array structure with the electrode structure illustrated in the figures as a basic unit. The present embodiment is described on the basis of one basic unit for the sake of clarity. The TFT array substrate structure includes multiple sets of TFT components, capacitors, data signal lines 3, and common electrodes 4, all of which are formed on a substrate. The capacitors are coupled to the common electrodes 4. Each set of the TFT components includes a driving TFT, and the driving TFT includes a gate, a source, and a drain. A drain frame extends from the drain of the driving TFT and surrounds a pixel block of the TFT array substrate structure. A transparent conductive film is arranged in a region surrounded by the drain frame and is in contact with the drain frame.

Referring further to FIGS. 1-1 and 1-2, in an embodiment, each set of the TFT components includes a driving TFT and a switch TFT. The switch TFT includes a gate 11, a source 12, and a drain 13. For convenient description, the gate, the source, and the drain of the switch TFT are respectively named as a first gate, a first source, and a first drain. The driving TFT includes a gate 21, a source 22, and a drain 23. For convenient description, the gate, the source, and the drain of the driving TFT are respectively named as a second gate, a second source, and a second drain. A first semiconductor layer 14 is provided between the first source 12 and the first drain 13, and a second semiconductor layer 24 is provided between the second source 22 and the second drain 23. The first source 12, the first drain 13, the second source 22, and the second drain 23 are made of metal, and may be, but not limited to, Al, Mo, Cu, Ti or other metals and alloys, etc. The first source 12 is coupled to the data signal lines 3. The first drain 13 of the first TFT and the second gate 21 of the second TFT are coupled to each other. A frame 231 extends from the second drain 23 and surrounds the pixel block. A transparent conductive film 232 in contact with the frame 231 is arranged in the region enclosed by the frame 231. The transparent conductive film 232 corresponds to the pixel block, and is coupled to an anode or a cathode of an OLED or directly functions as the anode or the cathode of the OLED, so as to apply a driving voltage to the pixel block.

In the embodiment, the drain of the driving TFT is set to be the above-mentioned structure that the drain has the metal frame 231. The transparent conductive film 232 is arranged in and coupled to the frame 231, and the frame 231 and the transparent conductive film 232 constitute a pixel electrode. Comparing with a pixel electrode only using the transparent conductive film 232 having the same thickness, the resistance of the pixel electrode using the metal frame 231 is significantly reduced. Thus, in the case of the same resistance, the thickness of the transparent conductive film 232 that is coupled to the metal frame 231 is much smaller than that of the transparent conductive film alone. Therefore, in the actual manufacturing, the thickness of the transparent conductive film can be reduced by the arrangement of the metal frame, thereby reducing the manufacturing cost and the possibility of occurrence of a potential defect. In particular, for a flexible display devices, it can prevent the electrode structure from being broken or peeled off during repeated bending, thereby improving the reliability.

In the present embodiment, since the transparent conductive film 232 is arranged in and coupled to the metal frame 231, the thickness of the transparent conductive film 232 is reduced. The thickness can be generally reduced to 10 nm, and usually varies in a range from 10 nm to 300 nm. While the minimum thickness of a transparent conductive film of a traditional electrode structure is about 70 nm. It is apparent that the thickness of the transparent conductive film 232 is greatly reduced, thus a significant effect is provided. Alternatively, the width of the metal frame 231 may be within a range from 1 μm to 30 μm, further within a range from 1 μm to 10 μm. The resistance may be greatly reduced without a wide frame, thus the aperture ratio of a display device cannot be reduced.

Furthermore, the detailed structure of the electrode structure is illustrated in FIG. 1-2. The first gate 11, the second gate 21, and the common electrode 4 are arranged at the same layer and directly on a surface of the substrate 5. An insulation layer 6 is arranged above the layer. The first source 12, the second source 22, the first drain 13, the second drain 23, and the data signal line 3 are arranged at the same layer on the insulation layer 6. The capacitor is composed of a first sheet electrode 71 and a second sheet electrode 72 which are disposed opposite to each other and in parallel. The first sheet electrode 71 is integrally formed with the common electrode 4, and the second sheet electrode 72 is integrally formed with the first drain 13. In addition, the data signal line 3 may be integrally formed with the first source 12. The manner of being integrally formed is convenient for implementing process and simplifying the electrode structure, and is convenient for transmission and storage of electrical energy and transmission of drive signals.

Furthermore, a passivation layer 8 is arranged on the first source 12, the second source 22, the first drain 13, the second drain 23, and the data signal line 3. A first guide hole 91 is defined in the first drain 13, a second guide hole 92 is defined in the second gate 21, a third guide hole 93 is defined in the second sheet electrode 72, and a fourth guide hole 94 is defined in the second source 22. A larger guide hole (not illustrated) is defined in the frame 231 of the second drain 23, thereby exposing the frame 231. The first drain 13 and the second gate 21 are coupled to each other on the passivation layer 8 by conductive material 10 that is injected into the first guide hole 91 and the second guide hole 92. The second sheet electrode 72 and the second source 22 are coupled to each other on the passivation layer 8 by the conductive material 10 that is injected into the third guide hole 93 and the fourth guide hole 94.

Furthermore, in the present embodiment, a manufacturing process of the TFT array substrate structure is illustrated by taking a double TFT structure as an example, and the following steps are included.

a, the first gate 11, the second gate 21, and the common electrode 4 are formed on the substrate 5, as illustrated in FIGS. 2-1 and 2-2.

Figures 1, 3:
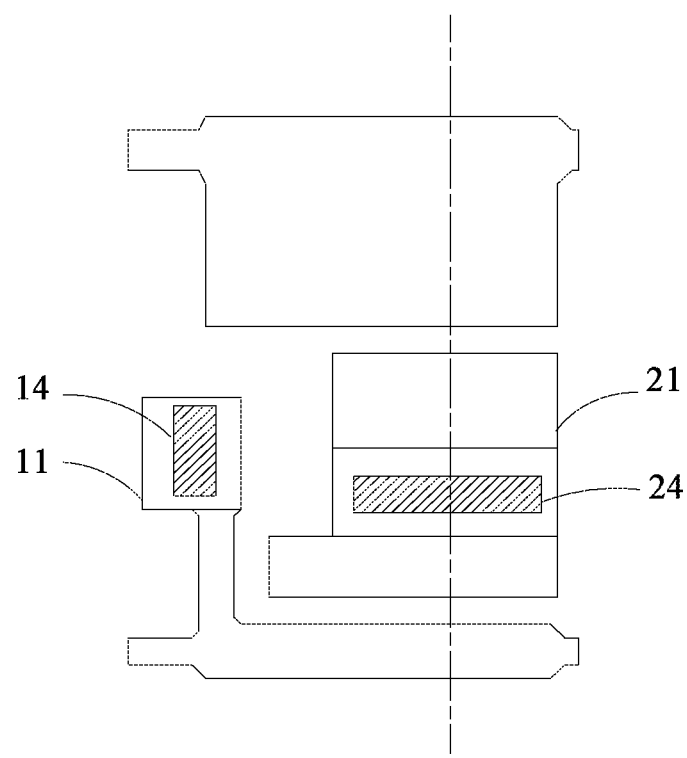
Figures 2, 3:
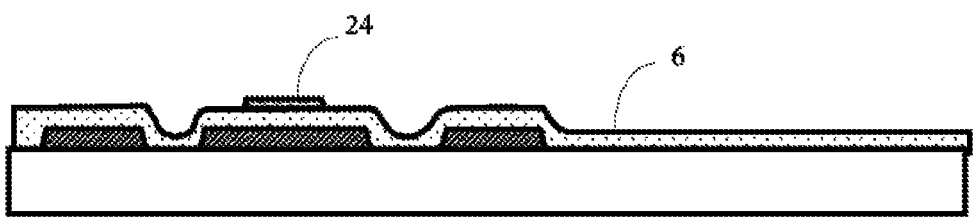

The substrate 5 may be made of glass, PET, PI, and the like. The first gate 11 and the second gate 21 may be made of Mo, Al, Cu, Cr, Ti, and the like. The common electrode 4 extends from the first sheet electrode 71.

b, the insulation layer 6, a first semiconductor layer 14, and a second semiconductor layer 24 are formed, as illustrated in FIGS. 3-1 and 3-2.

Figures 1, 4:
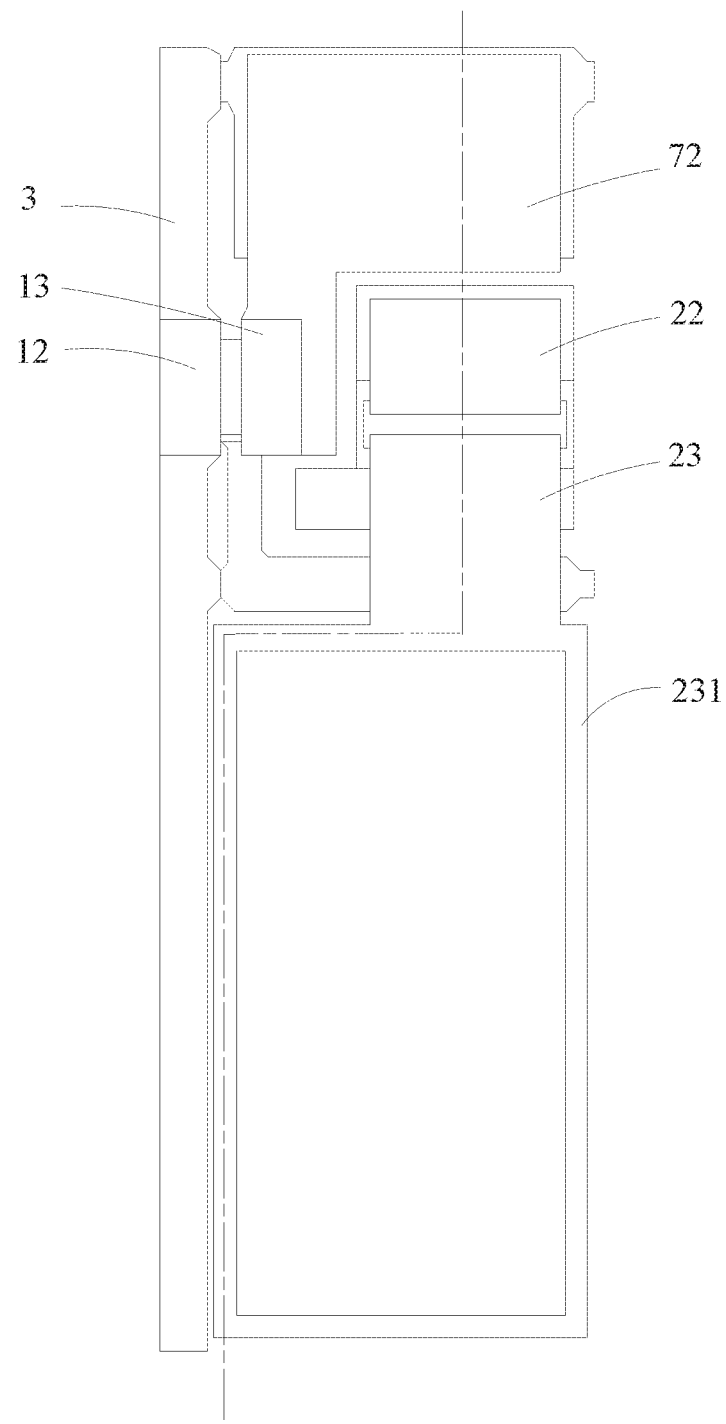
Figures 2, 4:
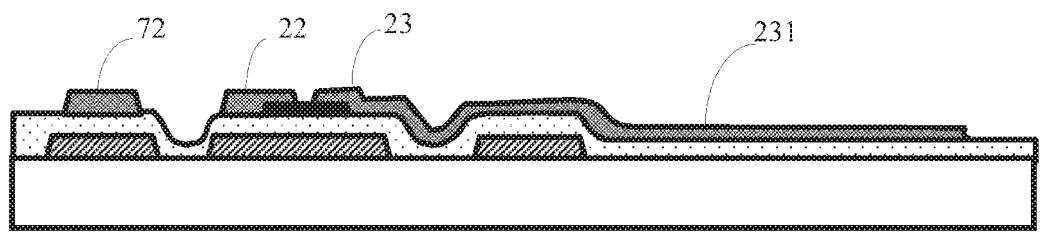

The insulation layer 6 is made by a thin film deposition process. The material can be SiNx, SiO$_2$, Al$_2$O$_3$, Resin, and the like. The process can be plasma enhanced chemical vapor deposition (PECVD), sputtering, vapor deposition, spin coating, and the like. The first semiconductor layer 14 and the second semiconductor layer 24 are then formed on the insulation layer 6. The first semiconductor layer 14 is aligned with the first gate 11, and the second semiconductor layer 24 is aligned with the second gate 21. The material of the first semiconductor layer 14 and the second semiconductor layer 24 may be a-Si, p-Si, metal oxides, organic material, and the like.

c, the first source 12, the second source 22, the first drain 13, the second drain 23, and the data signal line 3 are formed on the insulation layer 6, as illustrated in FIGS. 4-1 and 4-2.

The material may be Al, Mo, Cu, Mo/AlNd, Ti, and the like. As illustrated by FIG. 4-1, the second drain 23 formed is illustrated, and the frame 231 extends from the second drain 23. The width of the frame 231 is within a range from 1 μm to 30 μm, preferably within a range from 1 μm to 10 μm.

Figures 1, 5:
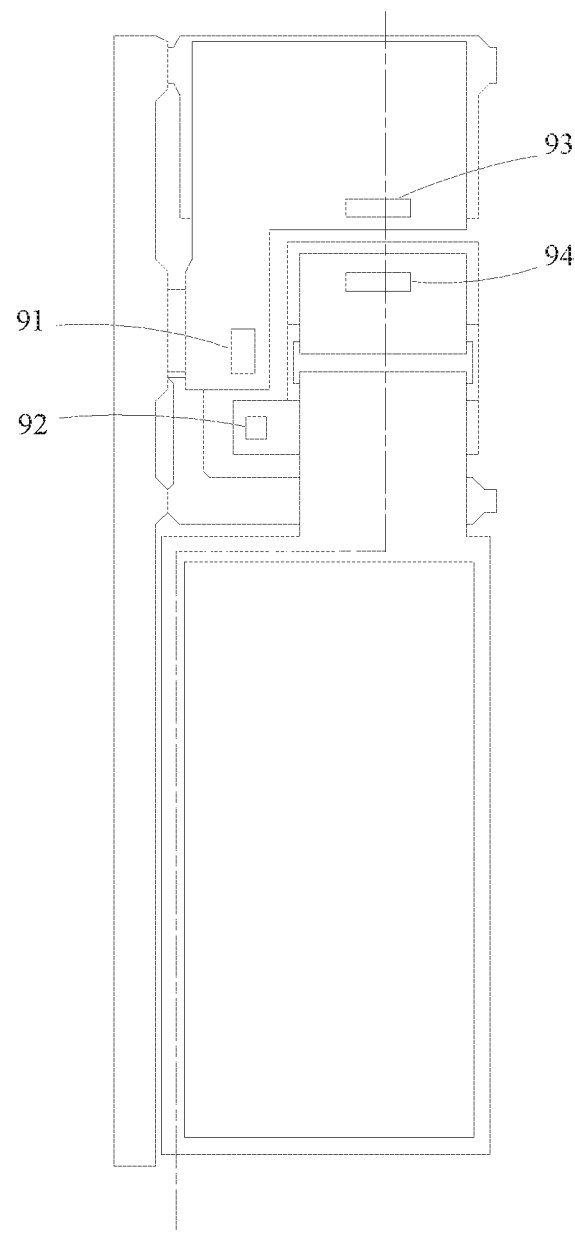
Figures 2, 5:
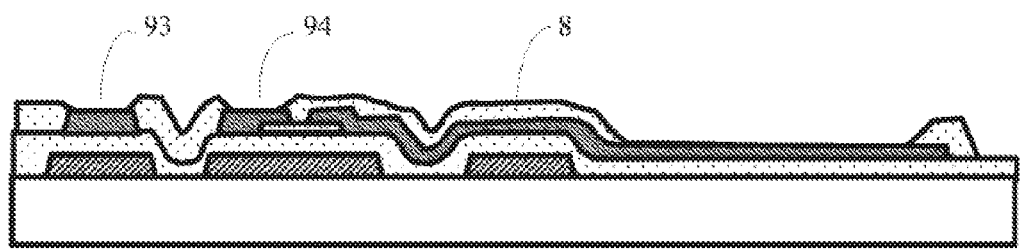

The data signal line 3 is integrally formed with the first source 12. The second sheet electrode 72 extends from the first drain 13. The second sheet electrode 72 and the first sheet electrode 71 are disposed opposite to each other and in parallel to form the capacitor.

d, the passivation layer 8 is formed on the first source 12, the second source 22, the first drain 13, the second drain 23, and the data signal line 3, as illustrated in FIGS. 5-1 and 5-2.

The passivation layer 8 is formed by way of deposition, and the material can be SiNx, SiO$_2$, Resin, etc. Guide holes are defined in the first drain 13, the second gate 21, the second source 22, the second sheet 72, and the frame 231 of the second drain 23. The frame 231 defines a larger guide hole so that the frame 231 is exposed, and the exposed portion corresponds to the OLED pixel block.

e, a transparent pixel electrode is formed and necessary electrical connections are realized, as illustrated in FIGS. 1-1 and 1-2.

The transparent conductive material 10 is deposited on the passivation layer 8, such as ITO, IZO, etc. The transparent conductive material 10 fills the guide holes, and the transparent conductive film 232 is formed in the frame 231. The transparent conductive material 10 is etched to form the structure illustrated in FIG. 1-1, in which the first drain 13 and the second gate 21 are coupled to each other, the second source 22 and the second sheet electrode 72 are coupled to each other, and the transparent conductive film 232 in the frame 231 is a pixel electrode for supplying a voltage to the OLED. The structure is suitable for a bottom emission mode.

The TFT array substrate structure of the embodiment of the present disclosure is suitable for use in an OLED display device. The thickness of the transparent conductive film is reduced due to the existence of the metal drain frame, thereby reducing the manufacturing cost of the OLED display device, avoiding the defect that electrodes are peeled off when the flexible OLED display screen is bent, and improving the reliability of the OLED display screen.

The foregoing descriptions are only preferred embodiments of the present disclosure, and is not intended to limit the present disclosure. Any modifications, equivalent replacements, and improvements made within the spirit and principle of the present disclosure shall fall within the protection scope of the present disclosure.

What is claimed is:

1. A thin film transistor (TFT) array substrate structure based on organic light-emitting diodes (OLEDs), comprising:
    a plurality of sets of TFT components;
    capacitors;
    common electrodes; and
    data signal lines, wherein the plurality of sets of the TFT components, the capacitors, the common electrodes, and the data signal lines are formed on a substrate, each of the plurality of sets of the TFT components comprises a driving TFT, and the driving TFT comprises a gate, a source, and a drain;
    wherein a drain frame extends from the drain and surrounds a pixel block of the TFT array substrate structure; and a transparent conductive film is arranged in a region surrounded by the drain frame and is in contact with the drain frame;
    wherein each of the plurality of sets of the TFT components further comprises a switch TFT, the switch TFT comprises a gate, a source, and a drain, the source of the switch TFT is coupled to the data signal line, and the drain of the switch TFT is coupled to the gate of the driving TFT; and
    wherein the capacitor comprises a first sheet electrode and a second sheet electrode that are disposed opposite to each other and in parallel, the gate of the switch TFT, the gate of the driving TFT, the common electrode, and the first sheet electrode are arranged in a first layer on a surface of the substrate, the source and the drain of the switch TFT, the source and the drain of the driving TFT, the data signal line, and the second sheet electrode are arranged in a second layer, and separated from the first layer by an insulation layer.

2. The TFT array substrate structure of claim 1, wherein the data signal line is coupled to the source of the switch TFT to form an integral whole.

3. The TFT array substrate structure of claim 1, wherein the common electrode is coupled to the first sheet electrode to form an integral whole, and the drain of the switch TFT is coupled to the second sheet electrode to form an integral whole.

4. A thin film transistor (TFT) array substrate based on organic light-emitting diodes (OLEDs), comprising:
    a plurality of driving TFTs, wherein each of the plurality of the driving TFTs comprises a gate, a source, and a drain, and a drain frame extends from the drain; and
    a transparent conductive film, wherein the transparent conductive film is arranged in a region surrounded by the drain frame and is in contact with the drain frame, the drain frame and the transparent conductive film form a pixel electrode;
    wherein the transparent conductive film has a thickness within a range from 10 nm to 300 nm.

5. A thin film transistor (TFT) array substrate based on organic light-emitting diodes (OLEDs), comprising:
    a plurality of driving TFTs, wherein each of the plurality of the driving TFTs comprises a gate, a source, and a drain, and a drain frame extends from the drain; and
    a transparent conductive film, wherein the transparent conductive film is arranged in a region surrounded by the drain frame and is in contact with the drain frame, the drain frame and the transparent conductive film form a pixel electrode;
    wherein the drain frame has a width within a range from 1 μm to 30 μm.

* * * * *